(12) United States Patent
Parr

(10) Patent No.: US 10,211,607 B2
(45) Date of Patent: Feb. 19, 2019

(54) DEVICE FOR REMOTELY RACKING A CIRCUIT BREAKER INTO AND OUT OF A CIRCUIT BREAKER CRADLE

(71) Applicant: William R. Parr, Leamington (CA)

(72) Inventor: William R. Parr, Leamington (CA)

(*) Notice: Subject to any disclaimer, the term of this patent is extended or adjusted under 35 U.S.C. 154(b) by 135 days.

(21) Appl. No.: 15/171,414

(22) Filed: Jun. 2, 2016

(65) Prior Publication Data

US 2016/0276813 A1     Sep. 22, 2016

Related U.S. Application Data

(63) Continuation of application No. 13/641,568, filed as application No. PCT/CA2011/000530 on May 6, 2011, now abandoned.

(60) Provisional application No. 61/346,995, filed on May 21, 2010.

(51) Int. Cl.
| | |
|---|---|
| *H02B 11/127* | (2006.01) |
| *H02B 1/52* | (2006.01) |
| *H02B 3/00* | (2006.01) |
| *H01F 27/00* | (2006.01) |
| *H02B 11/00* | (2006.01) |
| *H05K 7/14* | (2006.01) |
| *H01F 27/06* | (2006.01) |
| *H05K 7/18* | (2006.01) |
| *H02K 7/00* | (2006.01) |

(52) U.S. Cl.
CPC ......... *H02B 11/127* (2013.01); *H01F 27/002* (2013.01); *H01F 27/06* (2013.01); *H02B 1/52* (2013.01); *H02B 3/00* (2013.01); *H02B 11/00* (2013.01); *H02K 7/003* (2013.01); *H05K 7/14* (2013.01); *H05K 7/1401* (2013.01); *H05K 7/18* (2013.01)

(58) Field of Classification Search
CPC .......... H02B 1/52; H02B 3/00; H02B 11/127; H02B 11/00; H01F 27/002; H01F 27/06; H05K 7/14; H05K 7/18
See application file for complete search history.

(56) References Cited

U.S. PATENT DOCUMENTS

| | | | |
|---|---|---|---|
| 3,235,681 A * | 2/1966 | Pokorny | H02B 3/00 200/50.25 |
| 5,453,587 A | 9/1995 | Hurley et al. | |
| 5,477,017 A | 12/1995 | Swindler et al. | |
| 5,519,367 A * | 5/1996 | Castonguay | H01H 71/46 335/14 |
| 6,031,195 A * | 2/2000 | Meili | H01H 71/462 200/318 |
| 6,777,627 B1 | 8/2004 | Stevenson | |
| 7,019,230 B1 | 3/2006 | Vaill et al. | |
| 8,261,433 B1 | 9/2012 | Ledbetter et al. | |

(Continued)

FOREIGN PATENT DOCUMENTS

WO      2009152599      12/2009

*Primary Examiner* — Minh Trinh
(74) *Attorney, Agent, or Firm* — Tarolli, Sundheim, Covell & Tummino LLP

(57) ABSTRACT

Disclosed is a device for remotely racking a circuit breaker into and out of a circuit breaker cradle received within a circuit breaker module. The device comprises an actuator configured to rotate a breaker shaft in a first direction and an opposite second direction to rack the circuit breaker into and out of the circuit breaker cradle without the need for an operator to attend in the vicinity of the circuit breaker module.

7 Claims, 13 Drawing Sheets

(56) References Cited

U.S. PATENT DOCUMENTS

| | | |
|---|---|---|
| 8,304,672 B2 | 11/2012 | Lee et al. |
| 2002/0053962 A1* | 5/2002 | Yamagata .............. H01H 71/46 335/132 |
| 2003/0090349 A1* | 5/2003 | Mody .................... H01H 71/70 335/68 |
| 2003/0200648 A1* | 10/2003 | Greer ....................... H02B 3/00 29/622 |
| 2008/0257694 A1 | 10/2008 | Blom et al. |
| 2009/0014291 A1 | 1/2009 | Stevenson |
| 2009/0084005 A1 | 4/2009 | Ramun |
| 2013/0194059 A1 | 8/2013 | Parr |

* cited by examiner

DEVICE FOR REMOTELY RACKING A CIRCUIT BREAKER INTO AND OUT OF A CIRCUIT BREAKER CRADLE

CROSS-REFERENCE TO RELATED APPLICATIONS

This application is a Continuation of U.S. patent application Ser. No. 13/641,568, filed Nov. 13, 2012 which is a national phase application of International Application No.: PCT/CA2011/000530, filed on May 6, 2011, which claims priority to U.S. 61/346,995, filed May 21, 2010, all of which are hereby incorporated by reference in their entirety.

FIELD OF THE INVENTION

This invention relates generally to modular skid frames of the type that may be used to house electrical components such as switch gear, transformers, motor controls, load centers, fused and un-fused disconnects, breakers, electrical bus and the like. In another aspect the invention relates generally to the field of reducing arc flash hazards.

BACKGROUND OF THE INVENTION

Skid frames for housing electrical components have been used in the mining, exploration, oil and gas, and construction industries, and in general industry, for a considerable length of time. Typically, such skid frames include one or more of a variety of different electrical components that perform various functions as may be required at a particular application.

Skid frames as described above are generally constructed in a robust fashion from high strength material, such as steel, a steel alloy or a composite, in order to withstand the relatively harsh environments in which they will be called upon to operate. As their name suggests, they typically take the shape of a "frame" into which various components may be installed. The frames are typically mounted upon skids or runners that allow them to be easily pushed or dragged from location to location. Depending upon the equipment installed in them, skid frames used in mining, exploration, oil and gas, construction and industrial applications can cost from tens of thousands of dollars up to several hundred thousand dollars each. It will be therefore be appreciated that any effort that can be made to help to minimize their potential damage during use will be advantageous to their owners.

In numerous applications skid frames containing load centers, fused disconnects, breakers and similar components are situation within potentially dangerous environments where there may be the presence of explosive or ignitable gases or dust particles. Such environments not only include mining and oil and gas applications, but also numerous industrial, construction and manufacturing facilities. Under conditions of this nature the potential for an arc flash that can occur during the operation of electrical equipment is of significant concern. Typically, arc flashes occur during the operation of electrical equipment, such as drawing out or closing a circuit breaker, opening or closing an electrical device, or as a result of an insulation failure on electrical wires or systems. In situations where people are in close proximity to the equipment that it is being operated, arc flashes can present significant safety concerns, and in some cases have resulted in severe injury and death.

One of the most common interactions between humans and electrical components that can result in arc flashes is the racking in and out of a circuit breaker. In an effort to help minimize potential injury, others have proposed attempting to isolate breakers in sealed cabinets to prevent their exposure to potentially explosive gases and dust particles. However, even in cases where operators employ diligence and conduct routine and scheduled maintenance of their equipment, over time fasteners, gaskets and structural designs deteriorate making it difficult, at best, to eliminate the potential danger to human safety and life caused by arc flashes. It can also be extremely difficult to locate issues or potential issues that may compromise the arc flash resistance of equipment.

Accordingly, there is a need for the continued development of modular electrical skid frames having an enhanced ability to achieve a longer effective operating life. There is also a need to minimize the potential for injury or death associated with arc flashes that result from the operation of electrical equipment, and in particular circuit breakers, either within modular skid frames or situated elsewhere.

SUMMARY OF THE INVENTION

The invention therefore provides a new and improved modular skid frame that provides for the potential for an increased effective operating life through utilization of a novel mechanism to permit the skid frame to be lifted and moved through the use of front end loaders, scoop trams and the like without causing significant damage to the skid frame. The invention also provides for a new and novel mechanism to permit the joining of adjacent modular skid frames, of the same or different configuration, while accommodating shear loading between them. In the further embodiment the invention provides for a modular skid frame that includes a transformer having dampening means that cushions the transformer in both a horizontal and vertical orientation to accommodate vibration and movement of the transformer, particularly when changing the orientation of the skid frame from a generally horizontal to a generally vertical position. In yet a further aspect the invention provides a device for opening and closing a circuit breaker without direct or indirect contact by an operator in order to reduce the potential for injury or death of the operator on account of arc flash.

The invention therefore provides a new and novel modular skid frame, a mechanism to join modular skid frames and a device for racking in and racking out a circuit breaker and the like that reduces the potential for injury or death of an operator on account of arc flash.

Accordingly, in one of its aspects the invention provides a modular skid frame comprising a plurality of frame members secured together to form said skid frame; and one or more hook members formed on one or more of said frame members such that said hook members do not extend laterally outwardly from said frame members, said hook members comprised of a downwardly oriented bill portion and upwardly oriented bowl portion, said bowl portion extending vertically upwardly and laterally behind said bill portion, said bowl portion opening into the surrounding environment vertically beneath said bill portion, said one or more hook members permitting the receipt of a bucket or blade from a loader, scoop tram or other construction or mining equipment into said bowl portion and behind said bill portion to facilitate the lifting and moving of said skid frame.

In a further aspect the invention concerns a modular skid frame comprising a plurality of frame members secured together to form said skid frame; a pair of coupling plates on at least one end of said skid frame, said coupling plates assisting in releasably securing said modular skid frame to an adjacent modular skid frame of the same or a different configuration; one or more first tubular members extending between said coupling plates; and, an elongate shear member received within one of said first tubular members when said skid frame is releasably secured to an adjacent modular skid frame, the ends of said elongate shear member rigidly secured to opposite sides of said adjacent modular skid frame, said elongate shear member, in conjunction with said first tubular member through which it is received, assisting in the securement of said modular skid frame to said adjacent modular skid frame and helping to accommodate shear loading between said respective modular skid frames.

The invention also provides a device for racking a circuit breaker into and out of a circuit breaker cradle, the device comprising actuating means operatively secured, directly or indirectly, to the circuit breaker cradle, said actuating means having an engaged and a disengaged position and being movable between said engaged and said disengaged positions, when moving from said disengaged to said engaged position said actuating means causing the circuit breaker to be racked or drawn into the cradle, when moving from said engaged to said disengaged position said actuating means drawing or racking the circuit breaker out from the cradle, said actuating means operable such that movement between said engaged and said disengaged positions is accomplished without direct or indirect contact by an operator.

In still a further embodiment the invention provides a device for racking a circuit breaker into and out of a circuit breaker cradle, the device comprising an actuator operatively connected to the circuit breaker cradle, said actuator movable between an engaged and a disengaged position such that moving said actuator from said disengaged to said engaged position causes the circuit breaker to be racked into the cradle and moving said actuator from said engaged to said disengaged position causes the circuit breaker to be racked out of the cradle, said actuator operably connected to a remote controlling system such that said actuator is movable between said engaged and disengaged positions through operation of said remote controlling system permitting said circuit breaker to be racked in and racked out without direct or indirect contact on the part of an operator.

Further aspects and advantages of the invention will become apparent from the following description taken together with the accompanying drawings.

DESCRIPTION OF THE DRAWINGS

For a better understanding of the present invention, and to show more clearly how it may be carried into effect, reference will now be made, by way of example, to the accompanying drawings which show the preferred embodiments of the present invention in which.

DESCRIPTION OF THE PREFERRED EMBODIMENT

The present invention may be embodied in a number of different forms. However, the specification and drawings that follow describe and disclose only some of the specific forms of the invention and are not intended to limit the scope of the invention as defined in the claims that follow herein.

Figure 1:
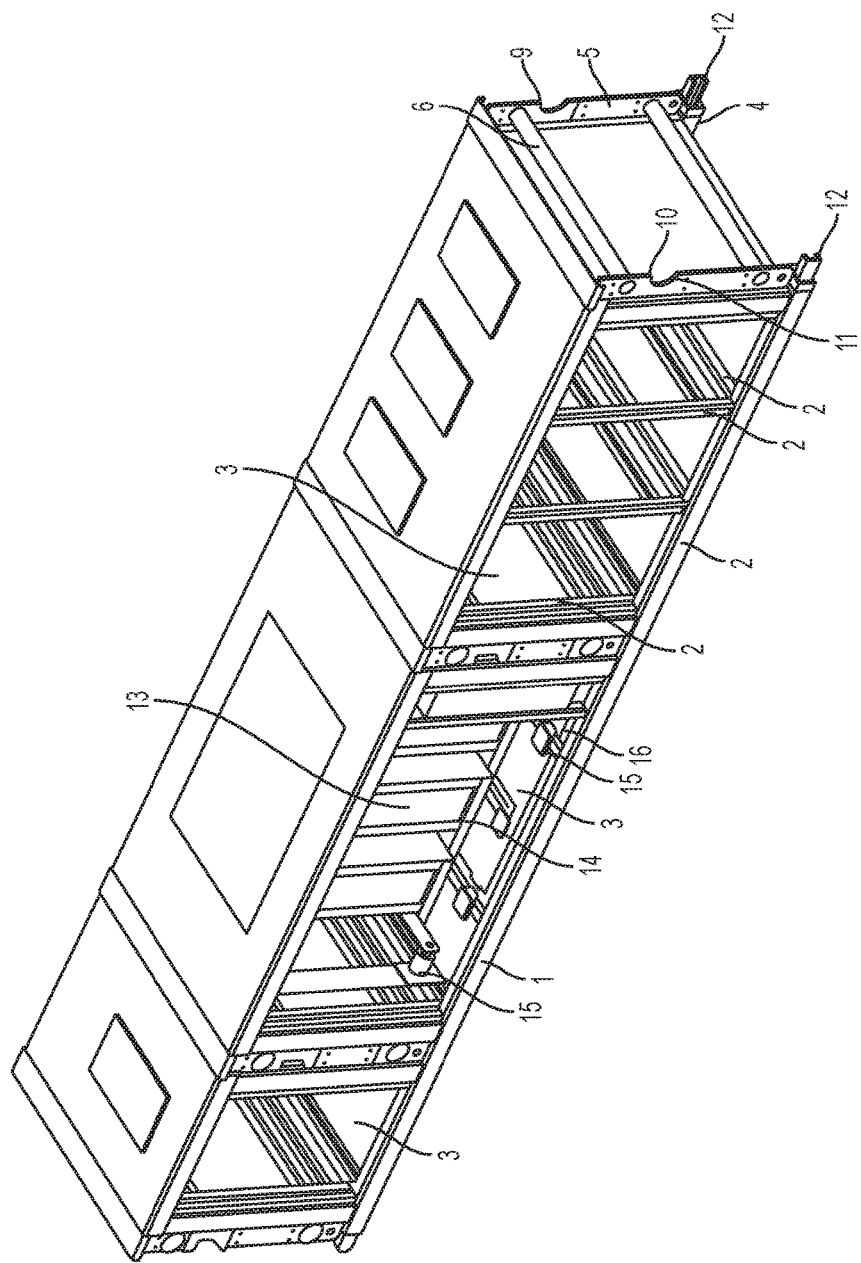
FIG. 1 is an upper side perspective view of a modular skid frame made in accordance with one of the preferred embodiments of the present invention.

With reference to FIG. 1, a modular skid frame constructed in accordance with one of the preferred embodiments of the present invention is noted generally by reference number 1. Skid frame 1 is comprised generally of a plurality of frame members 2 which would in most cases be constructed of a high strength material, such a as steel, a steel alloy or a composite. Depending up the particular application, the frame members may be subjected to hardening or heat treating processes, may be painted, coated for corrosion resistance, or have any one of a wide variety of other treatments applied to them. Typically the frame members would be assembled in a fashion to form one or more semi-enclosed compartments 3 designed to house particular equipment or structures. In so doing the frame members are most often arranged in a box-like manner with end frames sections, bottom frame sections, upper or top frame sections, and in some cases intermediary walls. The upper surface (or roof) of the skid frame will be commonly be enclosed to protect contained equipment. One or more skid rails 4 extend along the bottom frame section to act as runners to help facilitate dragging or pushing the skid frame from place to place.

In the embodiment of the skid frame shown in the attached drawings, the frame members include a pair of coupling plates 5 positioned on at least one end (but preferably both ends) of the skid frame. As will be described in further detail below, the coupling plates assist in releasably securing one skid frame section to an adjacent modular skid frame section that may be of an identical or a different configuration. Coupling numbers 5 have one or more first tubular members 6 extending laterally between them. In the embodiment shown in the drawings, two such tubular members are shown extending laterally across the end of the skid frame and between the coupling plates. Typically the coupling plates that extend outwardly from one end of the skid frame would be fitted with tubular members 6, while the coupling plates of the opposite end would not, thereby forming, in general terms, male and female ends on the modular skid frame. In this manner, when it is desired to secure two skid frame modules together end to end, the male end of one skid frame can be received within the female end of a second skid frame such that the coupling plates of the two skid frames modules nestle and can be bolted together.

Figure 3:
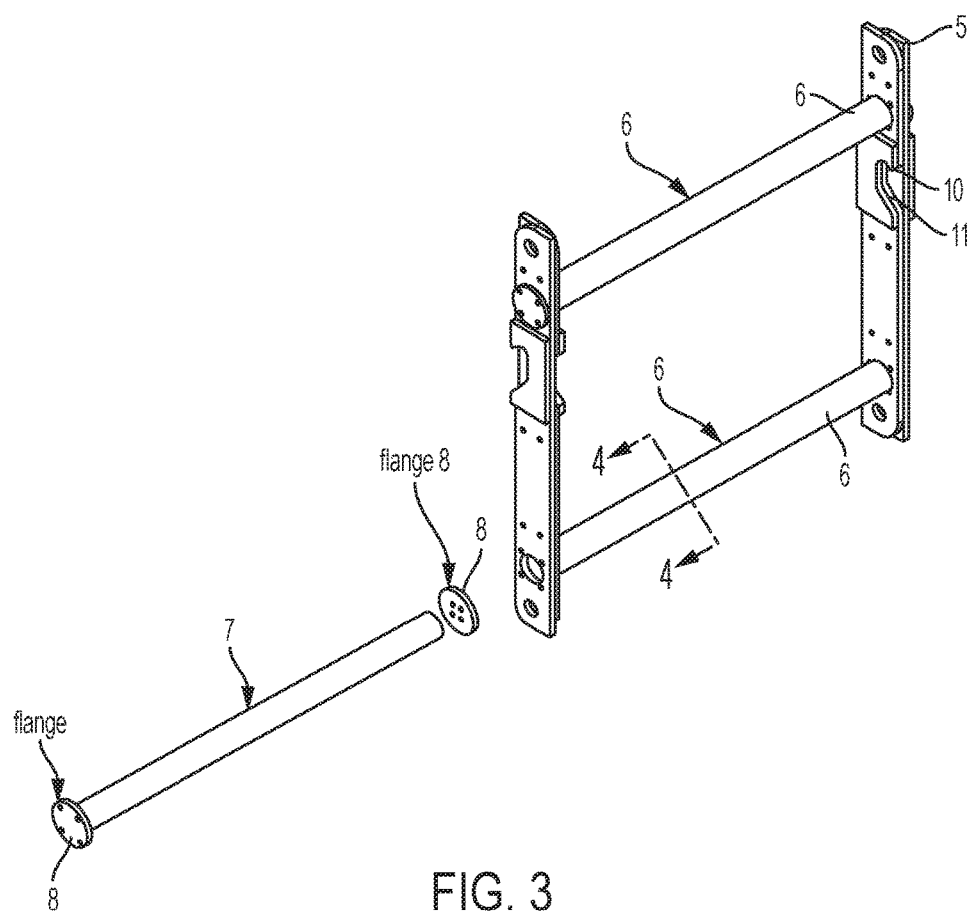
FIG. 3 is a partially exploded enlarged perspective view of the end detail of the modular skid frame shown in FIG. 1.
Figure 4:
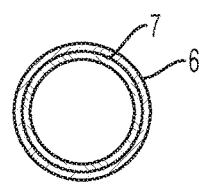
FIG. 4 is a sectional view taken along the line 4-4 of FIG. 3.
Figure 5:
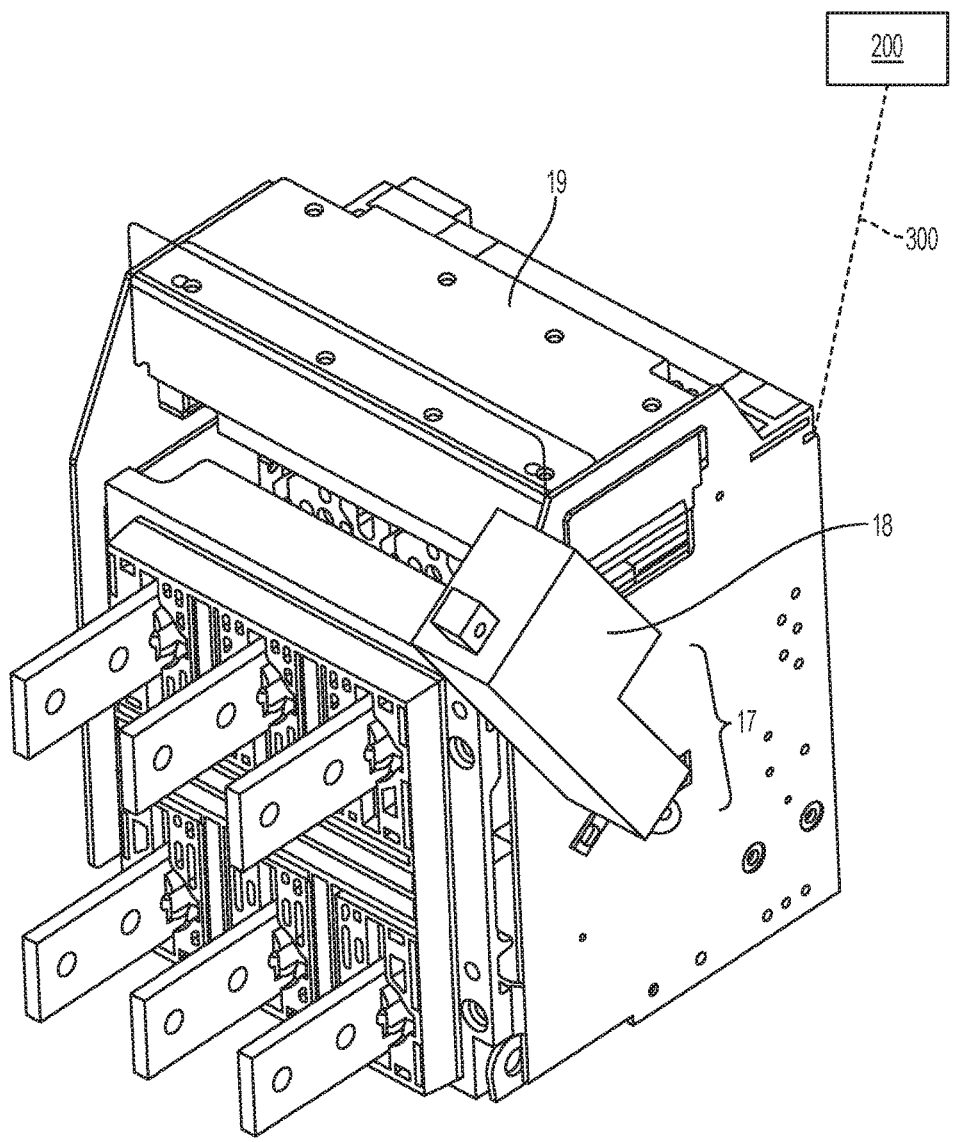
FIG. 5 is a upper side perspective view of a circuit breaker cradle incorporating a device for racking in and racking out a circuit breaker in accordance with one of the preferred embodiments of the present invention.
Figure 6:
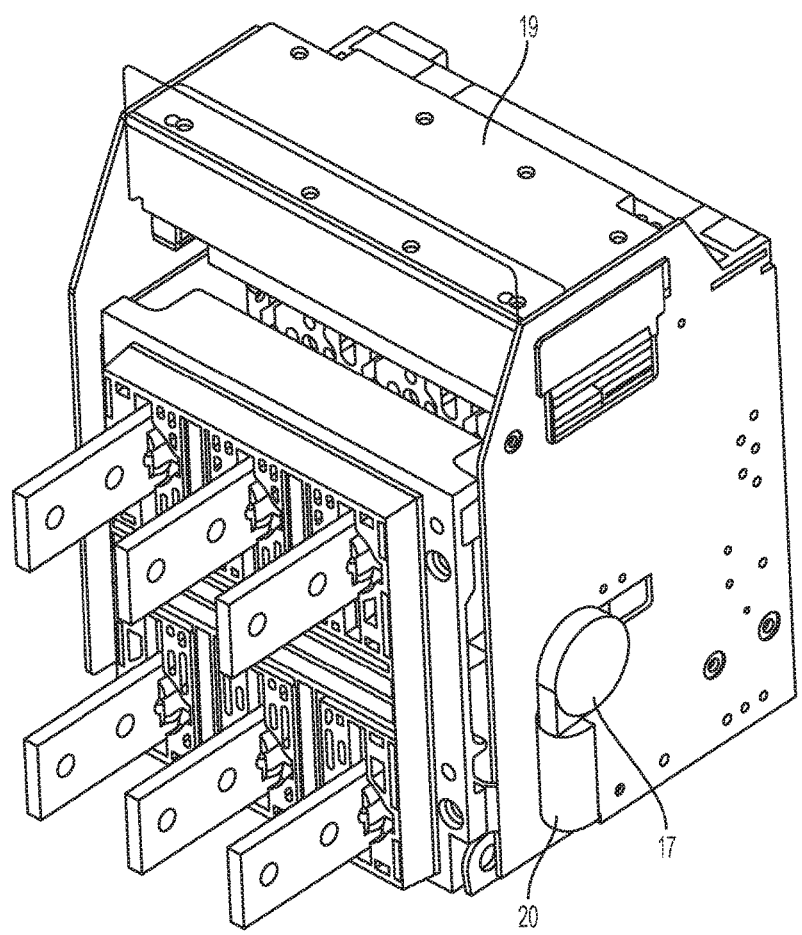
FIG. 6 is a side perspective view of the circuit breaker cradle shown in FIG. 5 incorporating an alternate embodiment of the device for racking in and racking out the circuit breaker.

With reference to FIGS. 3 and 4, when joining two modular skid frames (of the nature of those described above), together in an end to end relationship elongate shear members 7 are received within the first tubular members on the male end of the first skid frame. To accomplish this the coupling plates on the adjacent female end of the second skid frame will contain holes that line up with tubular members 6 on the first skid frame to permit the insertion of shear members 7. The ends of the elongate shear members have flanges 8 attached to them that in turn rigidly secure the shear members to the coupling plates of the female end of the adjacent skid frame. Preferably the cross-sectional shape of the elongate shear members closely match the hollow interior of the tubular members such that there is a relatively close tolerance between the parts when they are assembled together.

In most instances it is expected that the first tubular member and elongate shear members will be comprised of high strength pipe, with the pipe the forming elongate shear members closely fitting within internal diameter of the pipe forming the tubular members (see FIG. 4). It will be appreciated that in this manner when fully assembled the elongate shear member 7, in conjunction with the tubular member 6 through which is received, will not only assist in the securement of the two skid frames together, but will help to accommodate shear loading between the respective modular skid frames. In the embodiment of the invention shown in the attached drawings, there are two such tubular members, shear member structures positioned at each end of the skid frame. It will, however, be understood that one or more such tubular members could be utilized.

Figure 2:
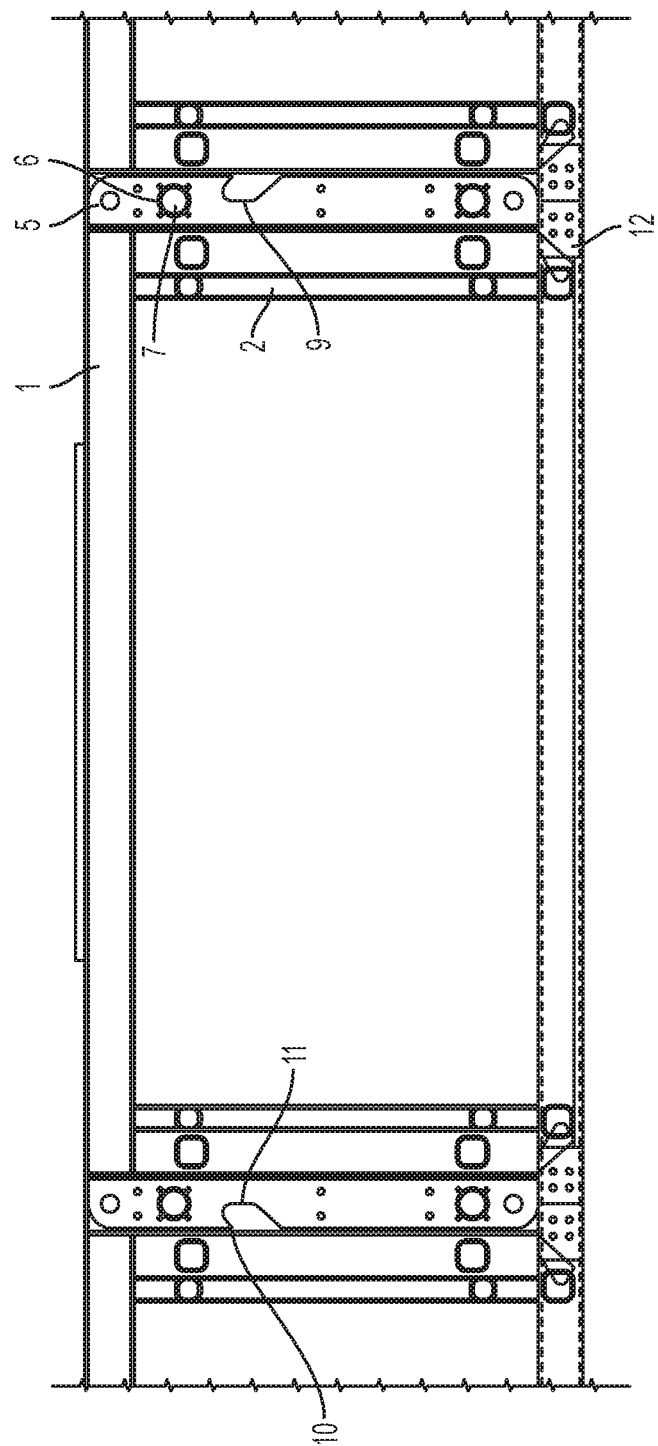
FIG. 2 is a partial front view of the modular skid frame shown in FIG. 1.

Referring to FIGS. 1, 2 and 3, one embodiment the modular skid frame includes one or more hook members 9 formed on one or more of the frame members 2. Hook members 9 are preferably recessed into the frame members such that they do not extend laterally outwardly from the frame members and thus do not impede the placing of the skid frame up against an object or wall, and to also help to minimize the risk that the hook members will catch on other objects, devices or equipment. Hook members 9 are comprised generally of a downwardly oriented bill portion 10 and an upwardly oriented bowl portion 11. As shown in FIGS. 1, 2 and 3 the bowl portion extends in a generally vertical direction upwardly and laterally behind the bill portion. The bowl portion has a mouth that opens into the environment vertically beneath the lower tip of the bill portion to effectively create an undercut structure behind the bill. Such a structure permits the receipt of a bucket or blade from a loader, scoop tram or similar piece of construction or mining equipment into bowl 11 and behind bill 10 of hook member 9 in order to facilitate the lifting and moving of the skid frame.

From an examination of FIG. 1 it will be appreciate that placing the front lip of a bucket into the hook members on the end of skid frame 1 will enable the bucket to be received behind the bill portions, and in so doing permit the end of the skid frame to be lifted so that the entire frame can easily be shifted in a lateral direction (left to right). Receipt of the bucket into the hooks and behind bills 10 will also allow the skid frame to be dragged or pushed to a desired location without damaging frame members 2. In the embodiment shown, hook members 9 are formed in coupling plates 5 and will thus be made from a high strength steel, steel alloy or a composite. For larger skid frames, an additional layer of material may be attached to the sides of coupling plates 5 at the point where the hook members are formed in order to increase the strength and rigidity of the hooks (see FIG. 3).

To help prevent flexing and torsional strain being applied to the skid frame when it is lifted or moved by means of hook members 9, coupling plates 5 may be positioned vertically along the outer ends of the skid frame, with each coupling plate each having a hook member 9 formed therein. In this manner a bucket received within the hook members will tend to lift, pull or push the skid frame by points of contact on the frame's corner members which will be of high structural integrity and which, due to their spacing apart, will help to reduce the tendency to twist or apply torsional loading to the frame. As shown in FIG. 2, the fact that hook members 9 do not extend laterally outwardly from the frame members means that the hook members do not interfere with the ability of the skid frame to be pushed up tightly against an adjacent skid frame thereby facilitating the joining of the two modules together. Securing two adjacent modules together can thus be accomplished through bolting their respective coupling plates together, through the use of elongate shear members received within first tubular members as discussed above, and through the use of coupling bars 12 that would typically be received within the bottom frame members.

It will also be appreciated that through the provision of one or more dedicated hook members 9 that are specifically designed to assist in the lifting and movement of the modular skid frame from place to place there will be a tendency to reduce damage that may otherwise be cause to the skid from through traditional manners of moving the skid frame. Commonly skid frames are moved through ramming a piece of equipment up against it in order to push or drag it into position. The use of specific and dedicated hook members will encourage operators to refrain from pushing against other frame members of the skid frame which may not have the same level of structural integrity of hook members 9 and coupling plates 5. Thus the described structure will have a tendency to reduce the potential for damage being caused to the skid frame, which will in turn help to increase its useful life and reduce the need and cost for maintenance.

FIG. 1 further shows an embodiment of the invention wherein modular skid frame 1 includes a transformer 13 (in this case 3 transformers mounted on a single base plate 14) that is secured either directly or indirectly to one or more of the frame members within the skid frame. That is, the transformer may be secured directly to the frame members or, alternatively, the transformer may be equipped with its own frame and mounting structure that is in turn secured to the skid frame. In this embodiment of the invention the transformer includes both vertically and horizontally oriented dampening means 15 that serve to both cushion the transformer and to help reduce vibration that is transmitted to it during movement of the skid frame. In the embodiment shown, the dampening means comprise spring dampening means 16, however, it will be appreciated that other forms of dampening means including hydraulic and pneumatic cylinders could equally be utilized. The dampening means may also include base insulators. Through using both vertical and horizontal dampening means, the skid frame enables the transformer to be isolated, to a certain degree, from vibration and the effects of impact that can occur when the skid frame is moved around. In mining, construction and other applications, modular skid frames such as those described herein are often moved by large heavy equipment and can be subjected to significant and violent forces. Further, in some instances the skid frames are lifted, tilted or even placed in a vertical orientation when being moved from place to place. The use of both vertical and horizontal dampening means to cushion and protect a transformer can thus reduce damage to it, increase its use for lifespan and potentially reduce the need and cost of maintenance procedures.

In accordance with a further embodiment of the invention there is provided a device for racking in and racking out a circuit breaker. It will be appreciated by those of ordinary skill in the art that racking in (drawing in) a circuit breaker into its cradle will result in a mechanical connection of the breaker's current carrying stabs with current carrying members of the cradle. Similarly racking out the breaker will disengage the breaker's current carrying stabs from current carrying members of the cradle.

In FIGS. 5 through 14 such a device is shown generically through the use of reference number 17. Device 17 comprises an actuating means or actuator 18 that is mounted exterior to a circuit breaker cradle 19. The actuating means is movable between an engaged and a disengaged position such that when it moves from its disengaged to its engaged position the actuating means causes a circuit breaker 50 to be racked into cradle 19. Similarly, when actuating means 18 moves from its engaged to its disengaged position the actuating means draws out or racks out breaker 50. In this manner, operation of actuating means 18 causes circuit breaker 50 to be either racked in or racked out, accordingly. As will be described in more detail below, in accordance with this aspect of the invention the actuating means is operable such that it may be moved between its engaged and disengaged positions without direct or indirect contact by an operator. FIGS. 5, 6, 7 and 8 show four of the many different potential configurations of actuating means that could be utilized in accordance with preferred embodiments of the present invention. It will be appreciated by those of ordinary skill in the art that for illustration purposes a particular form of circuit breaker cradle 19 has been shown, however, the invention is not limited to its application upon such cradles only and the invention may be applied to any of a wide of variety of circuit breaker cradles. It should also be appreciated that depending upon the nature of the cradle in question, the environment within which it is mounted, and also the nature of actuating means 18, device 17 may also be operatively secured to an enclosure or frame upon which the cradle is mounted. The actuating means may be electrically, hydraulically or pneumatically powered.

Of significant importance to device 17 is the fact that actuating means 18 is controlled remotely such that moving the actuating means between its engaged and disengaged positions can be accomplished without the presence of an operator in the vicinity of circuit breaker 50. The electrical, hydraulic or pneumatic powering of actuating means 18 presents the ability for device 17 to be controlled in a remote operator or control station which may be in a secure and safe location either in the same general vicinity as the breaker or, alternatively, in a completely different area of a construction site, a centralized location in an oil or gas field or plant, or in the case of an underground mine may be potentially be located at the surface. Control may also be through a wired or wireless network (300) and could include the option of remotely controlling equipment by means of a portable computer, smart phone or smart PDA (200).

Regardless of the particular location of the operator, the important factor is that he or she will be located a safe distance from circuit breaker 50 such that when it is racked out or racked in any arcing that may occur and any subsequent arc flash, while potentially damaging surrounding equipment, will not inflict harm upon personnel. Through use of device 17, personnel do not have to approach the equipment to operate it and can safely stay beyond the arc flash boundary. This presents a significant advantage over existing cradles and actuating systems that to one extent or another require an operator to be in either physical contact with the breaker and cradle, or to be within close proximity. In situations where long telescopic poles are used to rack in and rack out circuit breakers, such poles still have a practical limit to their length, after which they become unmanageable. Even the longest poles that can be handled by an operator require that operator to be relatively close to the circuit breaker. If the breaker is situated in an environment that contains explosive gases or dust particles, any arcing could result in a flash that ignites a sufficient amount of gas or dust particles to engulf the operator. It is for such reasons that operators in some instances are required by law, or by practices established by management, to wear protective suits and head gear when engaged in such tasks. Completely removing the operator from harm's way in such circumstances therefore presents a significant advancement over existing technologies.

The remote operation of device 17 also presents the ability to incorporate a wide variety of different sensors and monitoring mechanisms either in or around the vicinity of circuit breaker 50. For example, sensors (100) can be incorporated into the breaker to feed signals to the control station to indicate whether the breaker is in an open or a closed configuration and whether the breaker is racked in or racked out. In addition, sensors could be incorporated in or around the breaker or its cabinet to detect the nature of the surrounding environment (i.e. the presence of methane or other explosive gases or dust particles). Thermal sensors could be utilized to indicate breaker and/or buss temperature to signal an overheating situation. In some applications it may also be desirable to include lights and video cameras in which case real-time streaming video could be sent to an operator's console to visually display the condition of the breaker and its surrounding components. Where the overheating of the breaker or other components may be of particular concern an infra-red camera could be utilized to provide a heat signature of the breaker, the actuating means and various other related or connected equipment or components.

Figure 7:
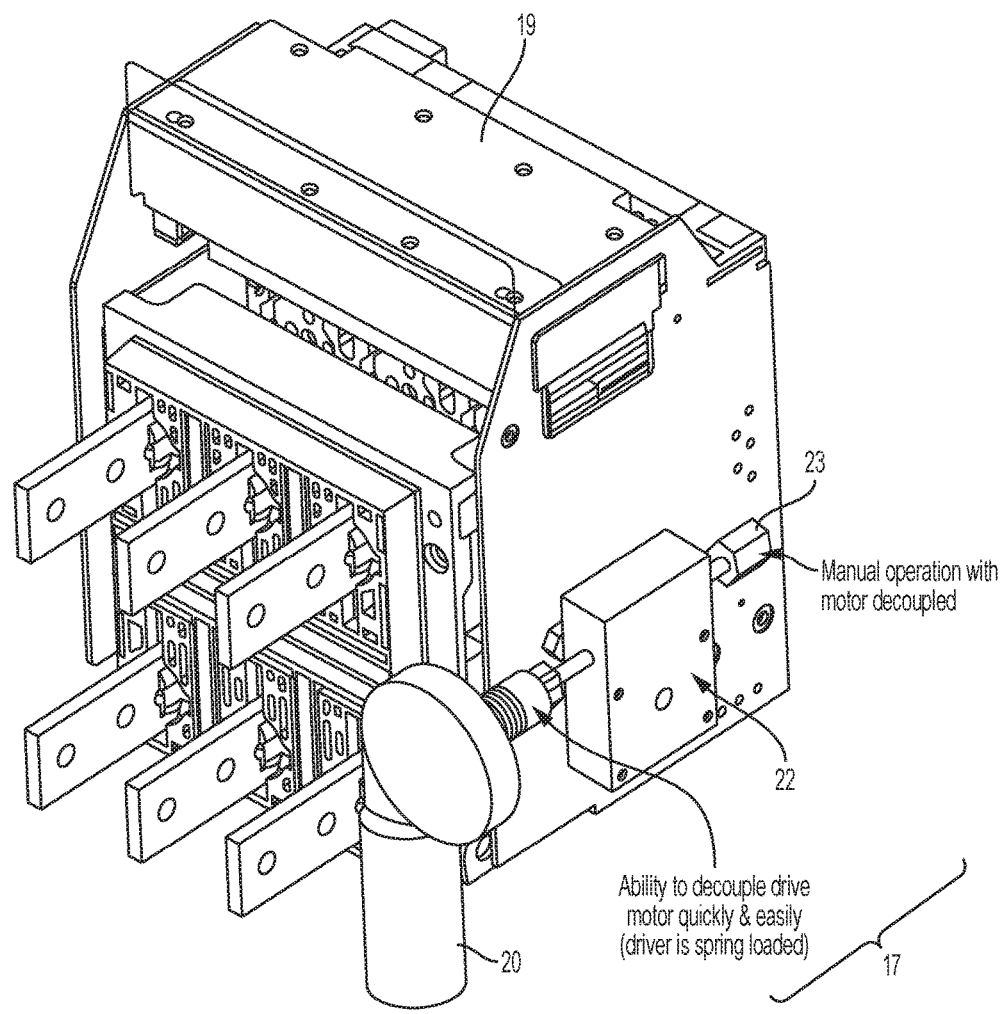
FIG. 7 is a side perspective view of the circuit breaker cradle shown in FIG. 5 incorporating a further alternate embodiment of the device for racking in and racking out the circuit breaker.
Figure 8:
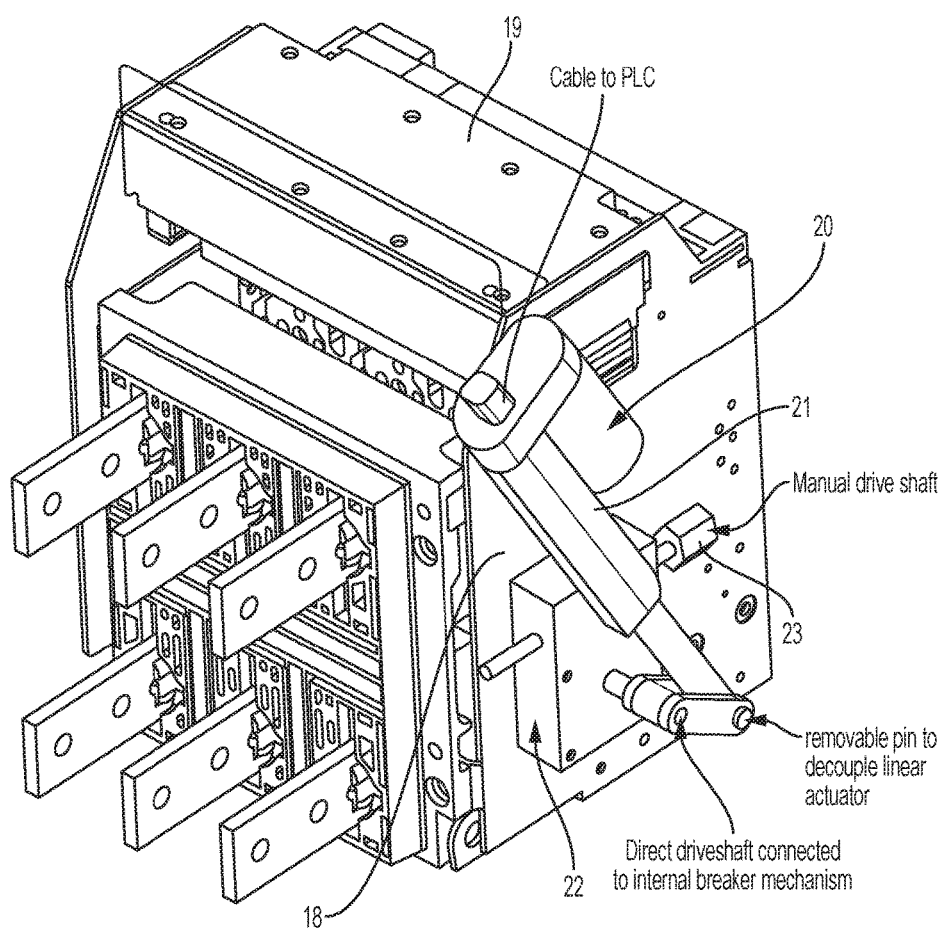
FIG. 8 is a side perspective view of the circuit breaker cradle shown in FIG. 5 incorporating yet a further alternate embodiment of the device for racking in and racking out the circuit breaker.
Figure 9:
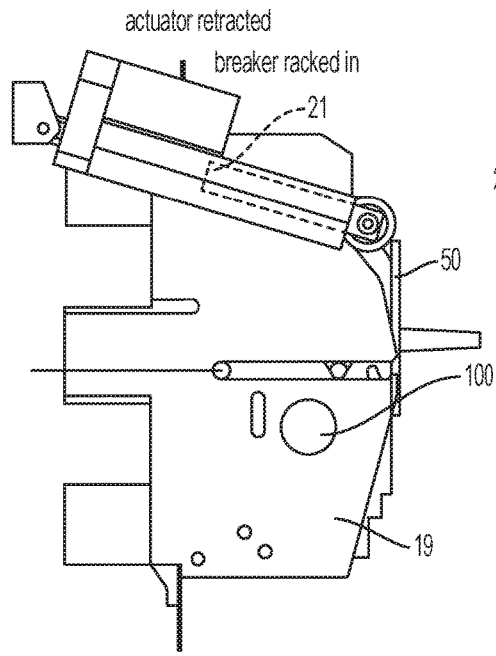
FIG. 9 is a side view of the circuit breaker cradle having secured thereto an embodiment of a device for racking in and racking out the circuit breaker in accordance with one of the preferred embodiments of the invention wherein the breaker is in a racked in position.
Figure 10:
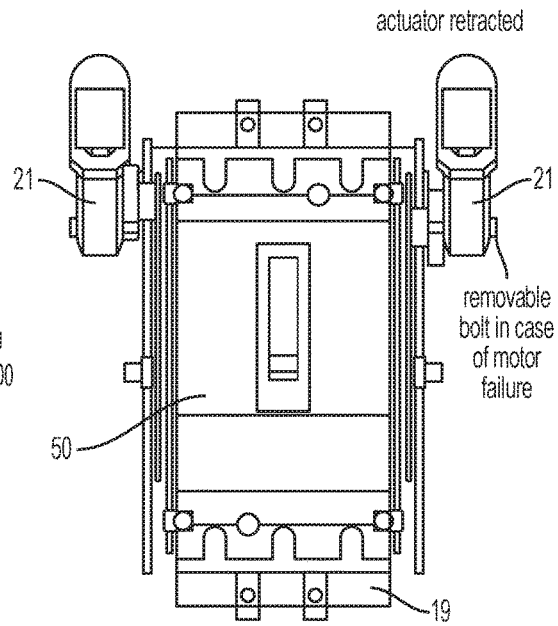
FIG. 10 is a front view of the circuit breaker cradle shown in FIG. 9.
Figure 11:
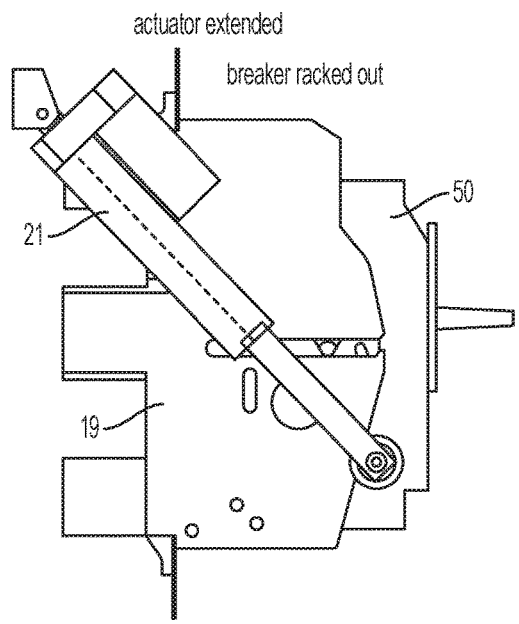
FIG. 11 is a side view of the circuit breaker cradle shown in FIG. 9 wherein the breaker is in a racked out position.
Figure 12:
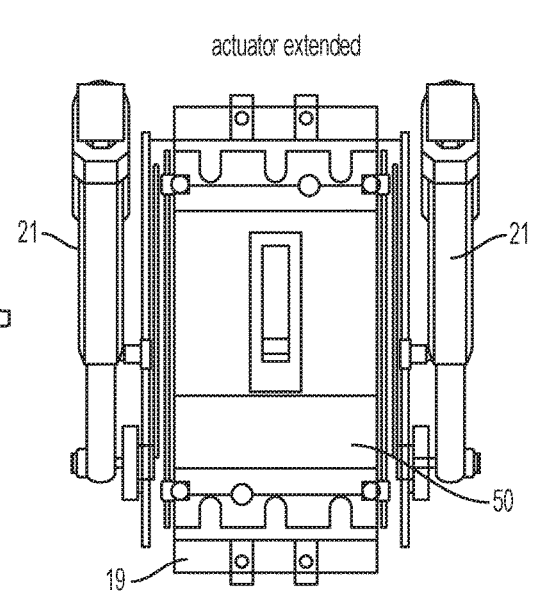
FIG. 12 is a front view of the circuit breaker cradle shown in FIG. 11.

Referring again to FIGS. 6 through 8, in FIG. 6 the embodiment of actuating means 18 that is shown comprises an actuator 20 in the form of an electric gear drive having its shaft operatively connected to cradle 19 to permit the breaker to be racked in and racked out. FIG. 7 shows an alternate embodiment of a similar gear drive actuator, whereas the embodiment shown in FIG. 8 depicts the use of a linear actuator (reversible drive) 21 that is connected to a drive box 22 that is turn operatively connected to the cradle 19.

FIGS. 9 through 12 show schematically a circuit breaker in a racked in and a racked out configuration. In these particular figures actuating means 18 is comprised of a pair of linear actuators, one situated on each side of the circuit breaker cradle 19. It will be appreciated that depending upon the particular breaker and cradle in question, and the configuration of the breaker and cradle, one, two or more actuators may be necessary in order to rack in and rack out the breaker or, alternatively, may be desirable in terms of an efficient operation or in terms of built in redundancy.

In accordance with a further aspect of the invention, actuating means 18 includes a manual override 23 to allow for the manual racking in and racking out of breaker 50. Depending upon the particular configuration of the actuating means and its actuator, manual override 23 may take one of a variety of different forms. In the embodiments shown in the enclosed drawings, manual override 23 is a drive shaft coupling 24 that is connected to drive box 22. The drive shaft coupling permits an operator to utilize either a manual handle or an electrically operated drive mechanism that may be connected to the drive box to manually to rack the breaker in or out. Manually racking the breaker in or out may be necessary or convenient in particular instances, such as when all power going to the breaker has been disconnected and there is no chance of an arc flash occurrence. Manual override 23 also permits the racking out of the breaker 19 in certain emergency situations when for one reason or another actuating means 18 may not be functional.

Figure 13:
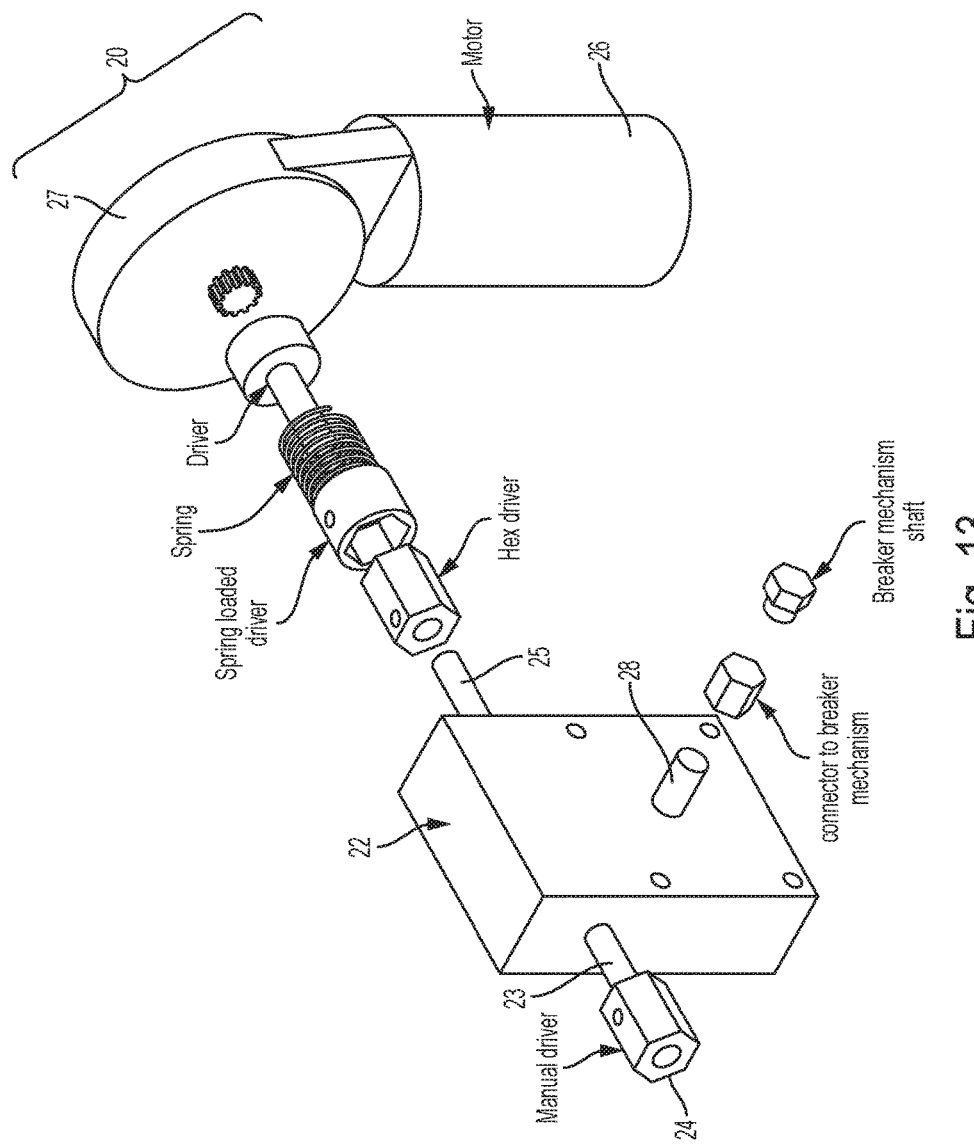
FIG. 13 is an exploded view of the device for racking in and racking out a circuit breaker as shown in FIG. 7.
Figure 14:
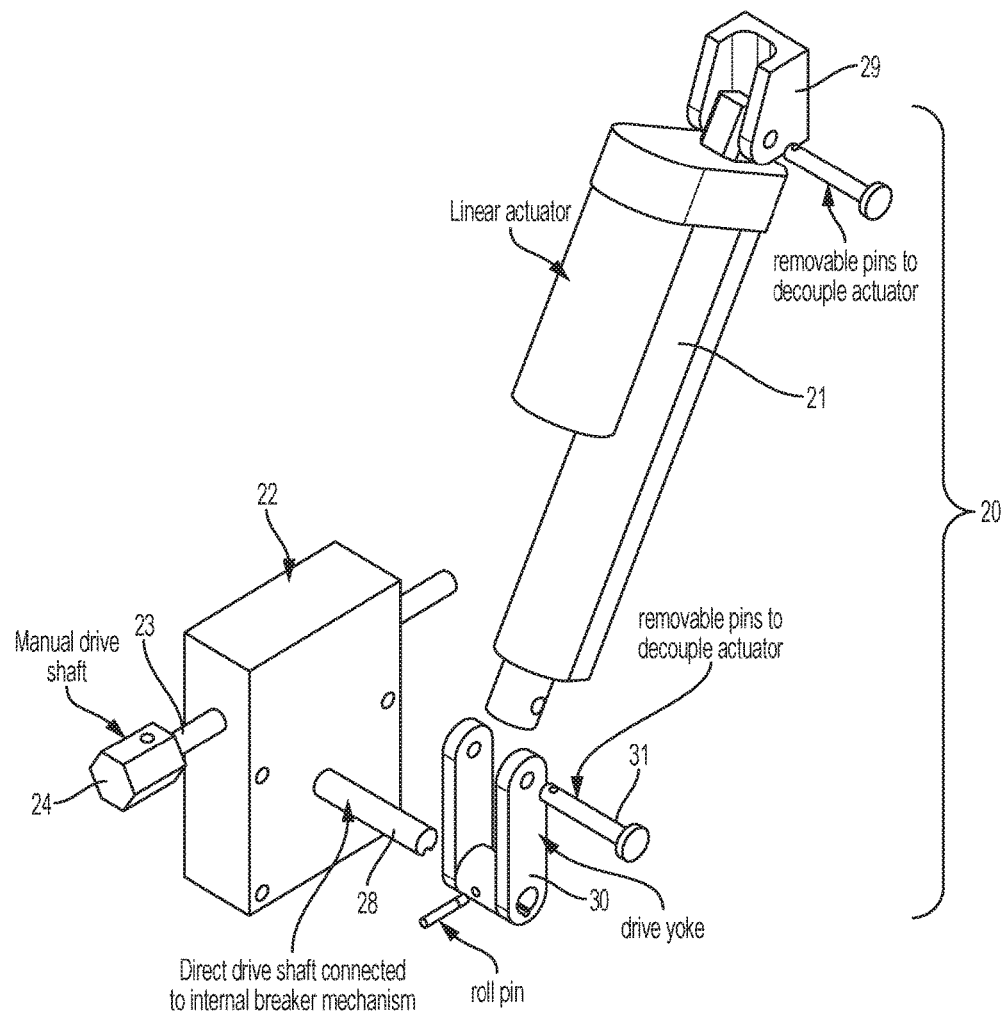
FIG. 14 is an exploded view of the device for racking in and racking out a circuit breaker as shown in FIG. 6.
Figure 15:
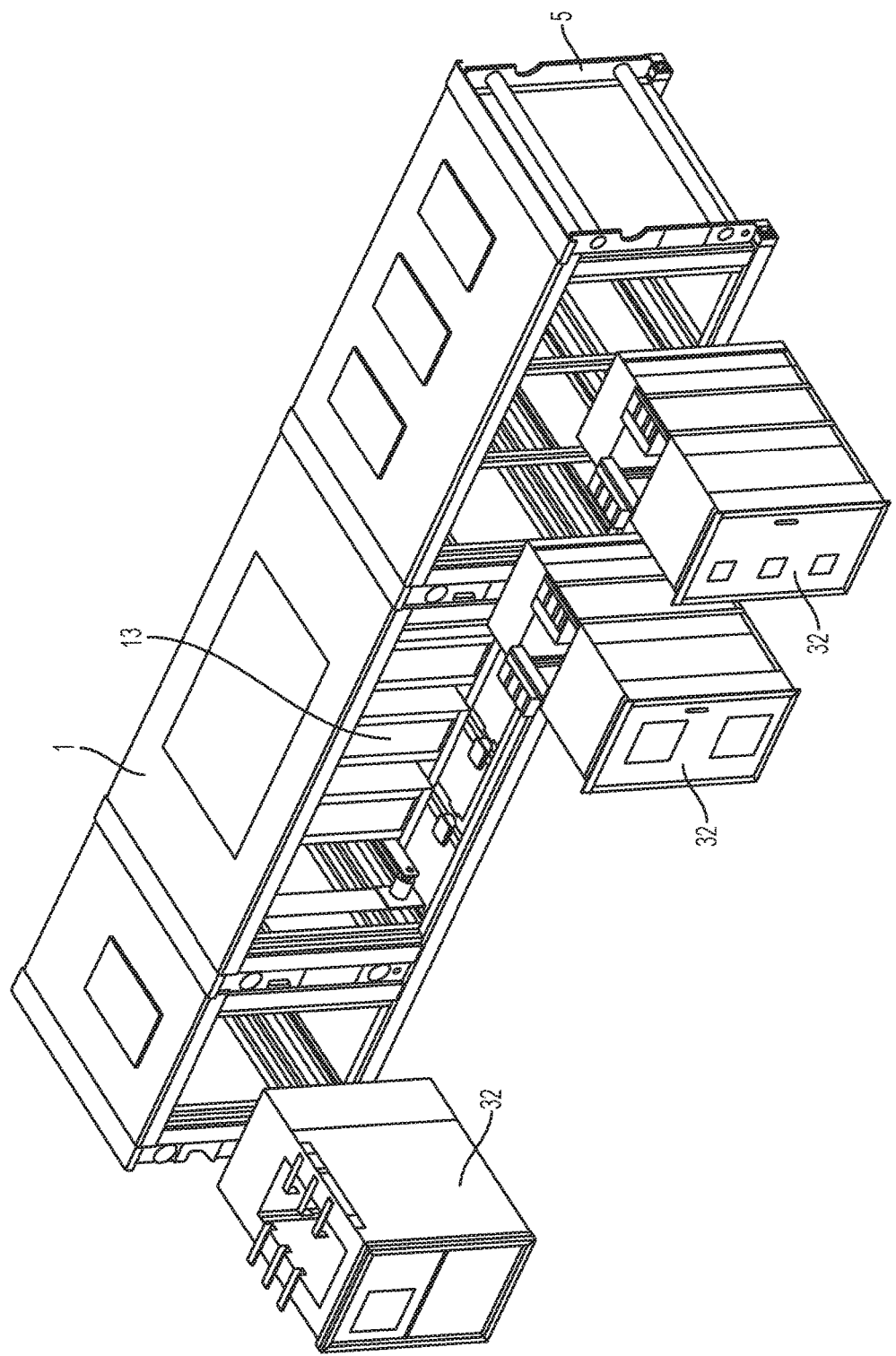
FIG. 15 is an exploded view of a modular skid frame made in accordance with one of the preferred embodiments of the present invention illustrating the electrical switching and control modules that may be received therein.
Figure 16:
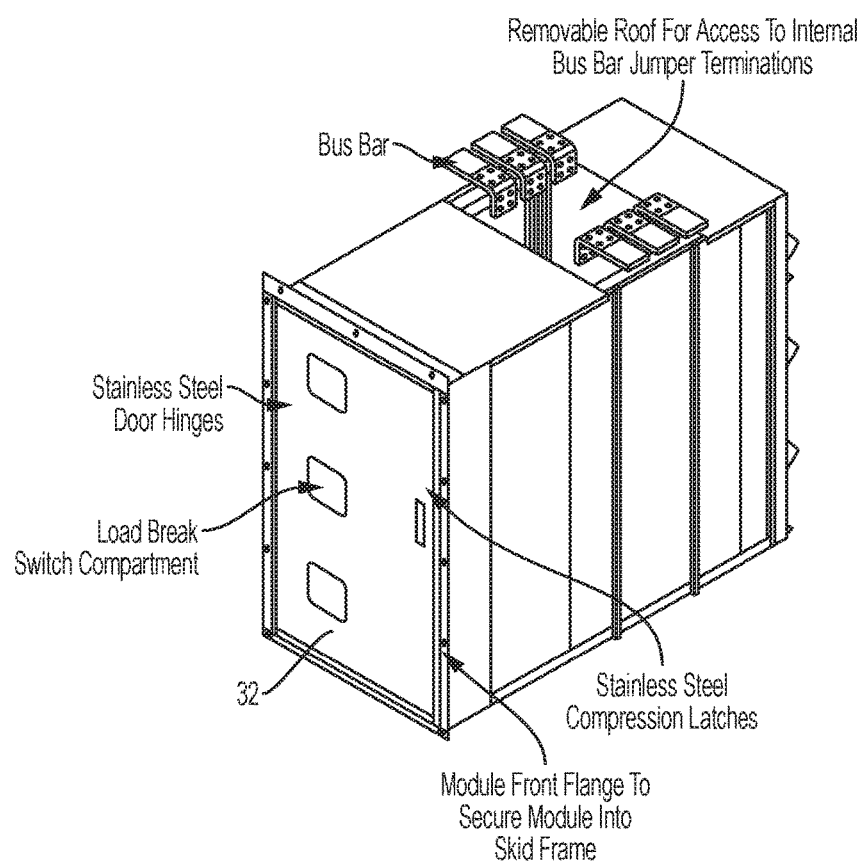
FIG. 16 is an upper front perspective view of a circuit breaker module that may be received within one embodiment of the modular skid frame.
Figure 17:
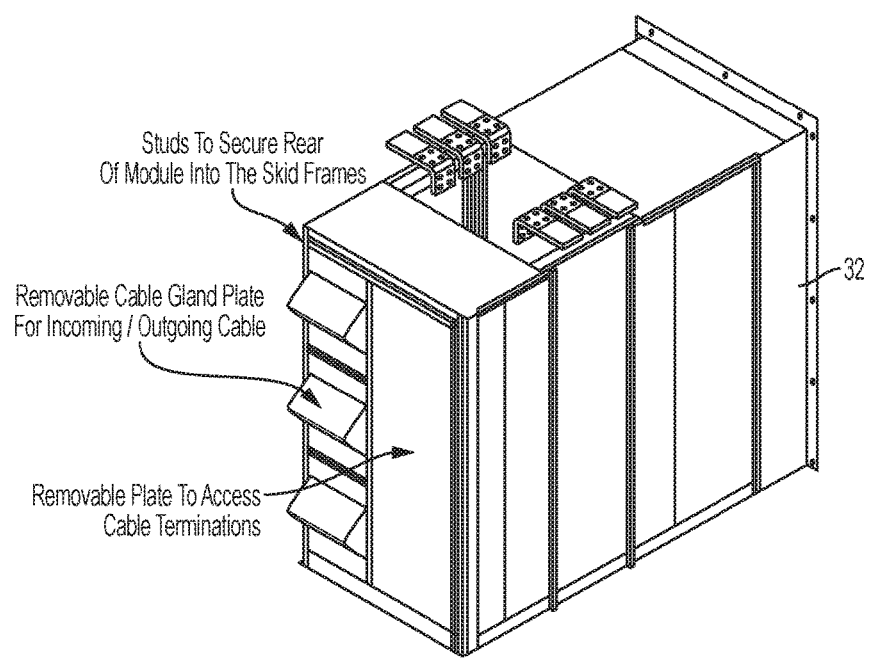
FIG. 17 is an upper rear perspective view of the circuit breaker module shown in FIG. 16.

FIGS. 13 and 14 show exploded views of two forms of actuating means that may comprise device 17 for racking the breaker in and out. In FIG. 13 there is shown an actuating means 18 that is comprised generally of an actuator 20 and a drive box 22. The drive box contains a breaker drive shaft 28 that is connected to the breaker mechanism (which includes the cradle). The drive box may in some cases also include a speed reducer (could be a worm gear reducer other form of speed reducer) having a shaft 25 that is connected to a motor 26 by way of a gear box 27. In FIG. 13 the motor is an electric motor, however, it may also be in some instances a hydraulic motor or a pneumatic power source. It will thus be appreciated that operation of the motor will result in the rotation of drive shaft 25, which will in turn result in the rotation of shaft 28 that will cause the breaker to be racked in or racked out, depending on the direction of rotation of motor 26.

A mechanically equivalent structure for actuator 20 to that as shown in FIG. 13 is depicted in FIG. 14. Here the actuator is comprised of a linear actuator 21, however, it could equally be an electric solenoid, a hydraulic or pneumatic cylinder or any other such or similar device. The linear actuator, at its upper end, is fitted with a bracket 29 that secures the actuator to the enclosure or frame to which circuit breaker cradle 19 is mounted. The opposite end of the actuator is connected to shaft 28 of drive box 22 through the use of a drive yolk 30. Operation of the actuator will thus cause shaft 28 to be rotated in either a clockwise or a counter-clockwise direction to cause the breaker to be either racked in or out. Due to the nature of the linear actuator, the manual racking in or out of the breaker will typically require the decoupling of the actuator from the drive yolk through removal of pin 31. In other embodiments the actuator may be coupled to the yolk through the use of other releasably securable fastening means.

It will thus be appreciated that through the use of device 17, the breaker may be racked in and racked out in a manner that helps to ensure the safety of personnel and that limits their exposure to arc flashes. The control system to which device 17 is connected (which may include PLC's and/or other micro processor controls and computers) permits not only the racking in and out of a breaker, but also provides for the monitoring of a wide range of system parameters and environmental factors. The control system may be programmed to automatically rack out the breaker in certain circumstances where a danger to personnel or equipment may be present, however, where there is an insufficient electrical issue to cause the breaker to trip. For example, it may be desirable to connect fire detection systems and sensors to the control system for the actuating means that automatically cause the breaker to be racked out in the event that a fire is detected. Previously, under such circumstances there would have to be a significant breach of an electrical system for the breaker to trip or, alternatively, an operator would have to physically go to the breaker cabinet and manually open the breaker or rack the breaker out using traditional means.

From a thorough understanding of the structure and function of device 17 it will be understood that the device may be utilized on breakers and breaker cradles that may be employed in any one of a very wide variety of different applications. For example, while reference has been made to use of device 17 in association with mining applications it could equally be used in surface plants, manufacturing facilities, oil and gas production sites, general commercial applications, construction applications, etc. The nature of device 17 is such that its usefulness and function is not limited to use on breakers that control any particular load or piece of equipment. Further, while in the embodiments of the invention shown in the attached drawings device 17 is depicted as being exterior to cradle 19, it will be appreciated that it could also be constructed so as to be an internal component situated within or inside the cradle.

It will also be appreciated that device 17 may be incorporated into a circuit breaker module 32 that may be received within modular skid frame 1. The breaker module would typically be connected to a bus bar within the skid frame to help reduce arc flash probability outside of situations where the breaker is racked in or racked out. The nature of module 32 and skid frame 1 is such that modules like those shown generally in the drawings and noted generally by reference numeral 32 are essentially plug-and-play modules that can be inserted into defined compartments within skid frame 1, allowing the skid frame to be configured as desired for any particular application. That is, in most instances modules 32 will be of one or more defined exterior dimensions so that different forms of modules (for example different breaker sizes, fused disconnects, control equipment, relays, etc) can be easily inserted and mounted within the skid frame. The plug-and-play nature of modules 32 also has a tendency to help minimize electrical wiring errors at site. The internal wiring of the modules can be completed more efficiently and with a greater degree of accuracy in an assembly plant, after which the fully wired and assembled modules can be shipped and inserted into a desired compartment within the skid frame. The various sensors and other monitoring equipment described above can also in most instances be pre-mounted within module 32. Doing so further reduces the likelihood of wiring errors on site and allows the sensors to be connected to a remote operating or control system through simply connecting a data cable on module 32 into a pre-existing port situated within the skid frame.

Since in most instances the functionality of the breaker cradle or other equipment housed within module 32 will be remotely controlled, the module will preferably have a fixed access door or cover having seals about its peripheral edge to help prevent the ingress of explosive gases, dust particles, moisture, etc. To ensure that equipment is inoperable while access doors or covers are open, electrical interlocks may be utilized to prevent the closing of switches and breakers while doors and/or covers of module 32 are either open or have been removed. Once again, as in the case of the other sensing devices described previously, if desired the status of the covers or doors of module 32 can be displayed remotely at the operator or control station.

It is to be understood that what has been described are the preferred embodiments of the invention and that it may be possible to make variations to these embodiments while staying within the broad scope of the invention. Some of these variations have been discussed while others will be readily apparent to those skilled in the art.

The invention claimed is:

1. A device for racking a circuit breaker into and out of a circuit breaker cradle within a circuit breaker module, the device comprising:
    an actuator fixed to a side of the circuit breaker cradle and positioned within the circuit breaker module, the actuator having
        a drive box having a breaker drive shaft, said actuator configured to rotate the breaker drive shaft in a first direction causing the circuit breaker to be racked into the circuit breaker cradle, and said actuator configured to rotate the breaker drive shaft in a direction opposite to the first direction causing the circuit breaker to be racked out of the circuit breaker cradle, an
        a reversible actuator drive forming part of said actuator and configured to operate said actuator to rotate the breaker drive shaft in at least one of said first and said opposite direction;
    a sensor fixed to the circuit breaker cradle and generating a signal corresponding to the status of the circuit breaker relative to the circuit breaker cradle; and
    a microprocessor control at a remote location relative to said circuit breaker module, said microprocessor control receiving, over a wired or wireless network, said signal generated by said sensor and operating said actuator drive, over the wired or wireless network, to remotely rack the circuit breaker into or out of the circuit breaker cradle without the need for an operator to attend in the vicinity of the circuit breaker module.

2. The device as claimed in claim 1 wherein said drive box includes a drive shaft, said drive shaft coupled to said breaker drive shaft through a speed reducer, said drive shaft having a first end and a second end, said first end having received thereon a manual driver, wherein rotation of the manual driver in one direction causes a rotation of the breaker drive shaft in a said first direction and at a reduced speed relative to the rotation of the manual driver, and rotation of the manual driver in an opposite direction causes a rotation of the breaker drive shaft in said second direction and at a reduced speed relative to the rotation of said manual driver.

3. The device as claimed in claim 2 wherein said actuator drive is a reversible electric motor connected to said second end of said drive shaft such that operation of said electric motor causes rotation of said breaker drive shaft in said first or said second direction.

4. The device as claimed in claim 3 wherein said electric motor is connect to said to said second end of said drive shaft through a gear box.

5. The device as claimed in claim 4 wherein said gear box is disengagable from second end of said drive shaft drive shaft to permit said drive shaft to be rotated with said manual driver without restriction from said electric motor or said gear box.

6. The device as claimed in claim 2 wherein said actuator drive comprises a linear actuator connected to said breaker drive shaft through a yoke, wherein activation of said linear actuator causes said yoke to rotate said breaker drive shaft in said first or said second direction.

7. The device as claimed in claim 6 wherein said yoke is disengagable from one or both of said linear actuator and said breaker drive shaft to permit said breaker drive shaft to be rotated with said manual driver without restriction from said linear actuator.

* * * * *